(12) United States Patent
White et al.

(10) Patent No.: US 8,847,606 B2
(45) Date of Patent: Sep. 30, 2014

(54) METHOD AND SYSTEM FOR ASSESSING INSULATION DETERIORATION IN LIVE UNDERGROUND POWER CABLES

(75) Inventors: Richard M. White, Berkeley, CA (US); Igor Paprotny, Berkeley, CA (US); Augusto Giovanni Gonzalez, South San Francisco, CA (US)

(73) Assignee: University of California, Berkeley, CA (US)

( * ) Notice: Subject to any disclaimer, the term of this patent is extended or adjusted under 35 U.S.C. 154(b) by 583 days.

(21) Appl. No.: 13/152,162

(22) Filed: Jun. 2, 2011

(65) Prior Publication Data

US 2012/0306510 A1    Dec. 6, 2012

(51) Int. Cl.
*G01R 31/02* (2006.01)
*G01R 27/06* (2006.01)
*G01R 31/12* (2006.01)
*H02G 1/00* (2006.01)
*H02G 9/00* (2006.01)
*G01R 27/16* (2006.01)

(52) U.S. Cl.
CPC ............... *G01R 31/021* (2013.01); *H02G 1/00* (2013.01); *H02G 9/00* (2013.01); *G01R 27/06* (2013.01); *G01R 31/1272* (2013.01); *G01R 27/16* (2013.01)

USPC ............................ 324/551; 324/541; 324/544

(58) Field of Classification Search
None
See application file for complete search history.

(56) References Cited

U.S. PATENT DOCUMENTS

| | | | |
|---|---|---|---|
| 3,803,484 A * | 4/1974 | Gray | 324/544 |
| 4,721,916 A * | 1/1988 | Hanasawa et al. | 324/544 |
| 4,980,645 A * | 12/1990 | Soma et al. | 324/541 |
| 6,617,859 B1 * | 9/2003 | Orton | 324/544 |

\* cited by examiner

*Primary Examiner* — Minh N Tang
(74) *Attorney, Agent, or Firm* — David R. Stevens; Stevens Law Group

(57) ABSTRACT

A method for assessing insulation deterioration in a live underground power cable may include, in one embodiment, attaching a coupling device to a live underground power cable and using the coupling device to couple a test signal onto the power cable. The power cable may carry a normal AC power signal at a first frequency, while the test signal may have a second frequency different from the first frequency. The test signal may be detected after it has traveled a distance along the power cable. It may then be analyzed to determine a change in velocity and/or attenuation of the test signal as a function of the normal AC power signal. The severity of water trees in the power cable may be inferred based on the magnitude of the change.

16 Claims, 7 Drawing Sheets

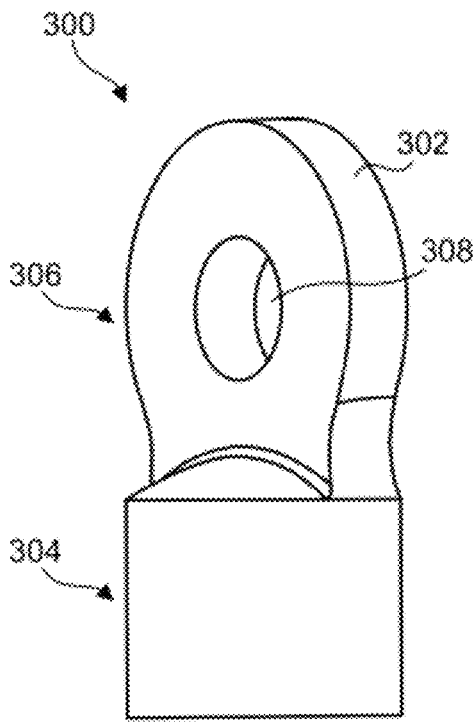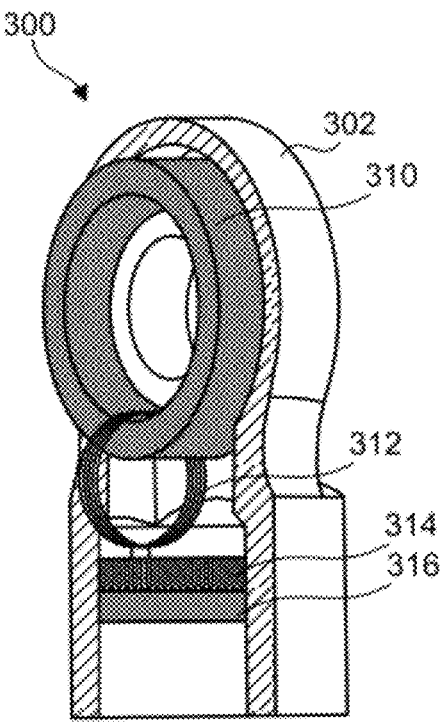
Fig. 3A  Fig. 3B
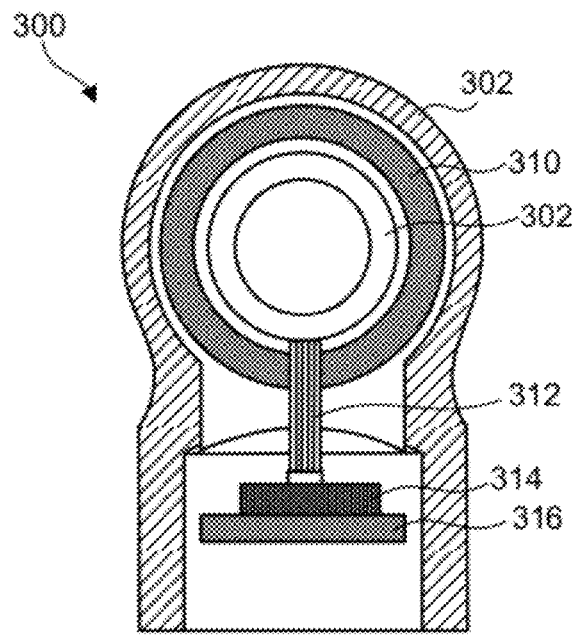
Fig. 3C

METHOD AND SYSTEM FOR ASSESSING INSULATION DETERIORATION IN LIVE UNDERGROUND POWER CABLES

BACKGROUND

This invention relates to electrical power distribution systems, and particularly to diagnostic tests for assessing insulation deterioration in underground electrical power distribution cables.

Underground power distribution cables are used extensively to convey electrical power to diverse locations. Typical power distribution cables are characterized by a core of one or more central conductors surrounded by a first semiconducting shield layer, a polymeric insulating layer, and a second semiconducting shield layer. Concentric neutral ("CN") wires may be helically wound around the core construction, and a polymeric jacket may be extruded over the CN wires.

The insulating layer electrically isolates the center conductor and first semiconducting shield from the second semiconducting shield. Degradation of the insulating layer may cause shorts or arcing to occur between the first and second semiconducting shields. In extreme cases, the arcs or shorting may cause a catastrophic failure of the power cable. At the very least, the arcs or shorting may further break down the insulating layer, thereby further compromising the integrity of the power cable.

One common cause of insulation degradation is the growth of structural faults within the insulation—a phenomenon known as "treeing." Treeing generally progresses through an insulating layer under electrical stress so that, if visible, its path looks something like a tree. "Water treeing" is the deterioration of a solid dielectric material which is simultaneously exposed to moisture and an electric field. Water trees may be driven by electro-oxidation of the insulating layer, which takes place in the direction of the local electric field and in a polar amorphous region of the insulating layer. As a result of the electro-oxidation, polymer chains are broken and a "track" or "tree path" is formed. The electro-oxidation of the polymer along this track enables water molecules to collect in the track region, which promotes further electro-oxidation of the polymer at the tip of the track.

Underground power distribution cables are particularly susceptible to "water treeing" due to their underground placement. Subterranean water molecules may infiltrate a track or tree path in the insulating layer, thereby accelerating tree formation and associated degradation of the insulating layer. After sufficient growth, such water trees may lead to conductive arcing and damage to the power distribution cable.

Low frequency testing, such as the tan-delta test, may assess deterioration of the insulation of a medium or high-voltage cable to predict the remaining life of the cable. Such testing, however, requires disconnecting and isolating the cable prior to applying a test voltage from a very low frequency power source. Low frequency testing tends to be negatively regarded by utility customers whose service must be turned off during testing. Such testing is also expensive and inconvenient for utility companies as a result of the lost service, as well as the usually costly, separate high-voltage source needed for testing.

In view of the foregoing, what are needed are apparatus and methods to perform diagnosis of energized power cable without interrupting power service. Further what are needed are apparatus and methods that utilize the usual applied power-frequency voltage on the cable to detect the existence of water trees and other damage to the cable insulation. Such apparatus and methods are disclosed and claimed herein.

BRIEF DESCRIPTION OF THE DRAWINGS

In order that the advantages of the invention will be readily understood, a more particular description of the invention briefly described above will be rendered by reference to specific examples illustrated in the appended drawings. Understanding that these drawings depict only typical examples of the invention and are not therefore to be considered limiting of its scope, the invention will be described and explained with additional specificity and detail through the use of the accompanying drawings, in which:

FIG. 3A is a perspective view of a coupling device to couple a test signal onto a live underground power cable in accordance with certain embodiments of the invention;

FIG. 3B is a cutaway perspective view of the coupling device of FIG. 3A;

FIG. 3C is a front cross-sectional view of the coupling device of FIG. 3A;

DETAILED DESCRIPTION

Figure 1:
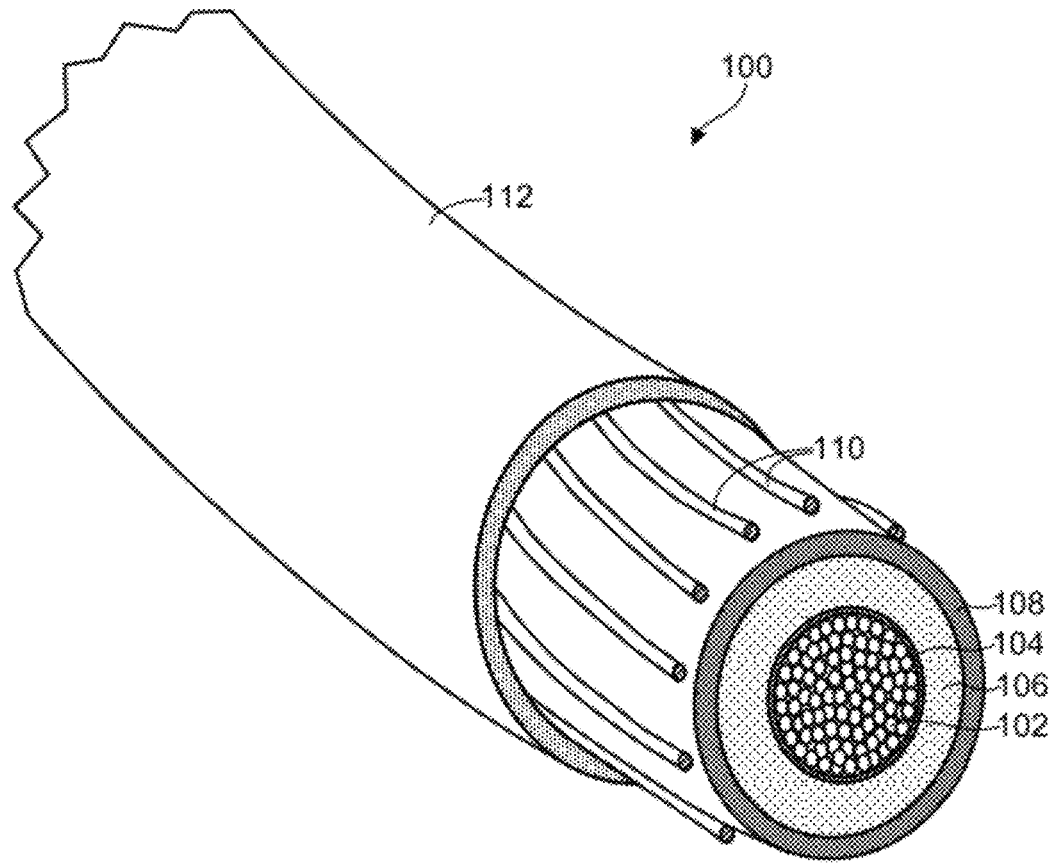
FIG. 1 is a perspective view of a jacketed underground power cable.

The invention has been developed in response to the present state of the art, and in particular, in response to the problems and needs in the art that have not yet been fully solved by currently available methods and apparatus for assessing insulation deterioration in underground power cables. Accordingly, the invention has been developed to provide a novel apparatus, system and method for assessing insulation deterioration by analyzing a test signal as a function of a normal AC power signal on a live underground power cable. The features and advantages of the invention will become more fully apparent from the following description and appended claims and their equivalents, and also any subsequent claims or amendments presented, or may be learned by practice of the invention as set forth hereinafter.

In one embodiment, an apparatus for assessing insulation deterioration in a live underground power cable may include a housing for mounting on a test point of a connector attached to a live underground power cable. An electrode may be coupled to the housing to connect to a center conductor of the live underground power cable. Coupling circuitry embedded within the housing and coupled to the electrode may be configured to couple a test signal to the center conductor, detect the test signal after it has traveled a distance along the live underground power cable, and transmit the detected test signal to an analysis device for analysis.

In another embodiment, a system for assessing insulation deterioration in a live underground power cable may include a test signal generation device, a coupling device, a detecting device, and an analysis device. The test signal generation device may generate a test signal. The coupling device may couple the test signal onto a live umderground power cable carrying a normal AC power signal. The test signal may have a frequency different from that of the normal AC power signal. The detecting device may detect the test signal on the power cable after it has traveled some distance along the live underground power cable. The analysis device may analyze the detected test signal to determine a change in velocity and/or attenuation of the test signal as a function of the normal AC power signal.

In yet another embodiment, a method for assessing insulation deterioration in a live underground power cable may include attaching a coupling device to a live underground power cable and using the coupling device to couple a test signal onto the power cable. The power cable may carry a normal AC power signal at a first frequency, while the test signal may have a second frequency different from the first frequency. The test signal may be detected after it has traveled a distance along the power cable. It may then be analyzed to determine a change in velocity and/or attenuation of the test signal as a function of the normal AC power signal. The severity of water trees in the power cable may be inferred based on the magnitude of the change.

It will be readily understood that the components of the present invention, as generally described and illustrated in the Figures herein, could be arranged and designed in a wide variety of different configurations. Thus, the following more detailed description of the embodiments of apparatus and methods in accordance with the present invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

With reference now to FIG. 1, an underground power cable 100 is typically an elongate, cylindrically-symmetric structure having a center conductor 102 designed to carry large electrical currents. The center conductor 102 may be a metallic conductor, such as solid or stranded copper or aluminum, or any other suitable conductor known to those in the art. The center conductor 102 may be surrounded by one or more semiconductive shields 104 and 108 and a dielectric insulating layer 106. In some embodiments, the dielectric insulating layer 106 may be sandwiched between inner and outer semiconductive shields 104 and 108, such that the semiconductive shields 104 and 108 may smooth out electrical fields through the dielectric insulating layer 106. The semiconductive shields 104, 108 may include, for example, a thin layer of a semi-conductive polymeric compound, such as a semi-conductive cross-linked polyethylene ("XLPE") compound. The dielectric insulating layer 106 may include, for example, polyethylene, XLPE, ethylene-propylene-rubber ("EPR"), or the like.

Multiple concentric neutral wires 110 may be substantially evenly spaced to surround and directly contact the outer semiconductive shield 108. In some embodiments, the concentric neutral wires 110 may include copper or aluminum wires helically wound around the outer semiconductive shield 108. In operation, the concentric neutral wires 110 may be at ground potential to protect against large current that might flow if the cable 100 is struck by lightening or accidentally hit or cut with an implement, such as a shovel. In certain embodiments, a polymeric jacket 112 may be extruded over the concentric neutral wires 110 to further insulate and protect the cable 100. The jacket 112 may be made of, for example, linear low density polyethylene, medium density polyethylene, or semi-conductive polyethylene.

Figure 2:
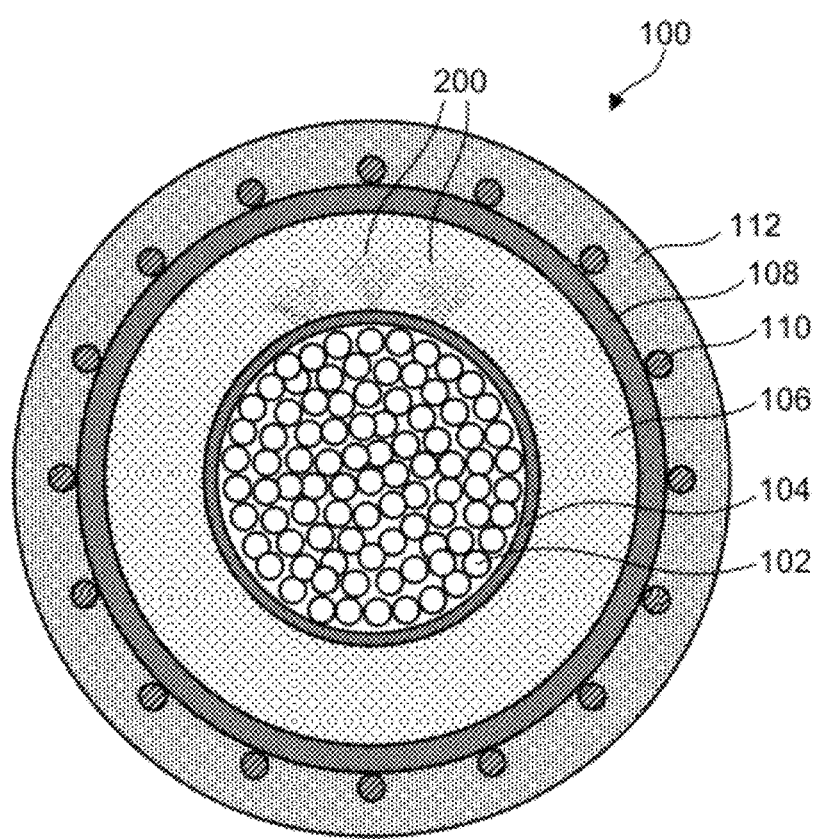
FIG. 2 is an end view of a jacketed underground power cable, illustrating water trees in the dielectric insulating layer.

Referring now to FIG. 2, in certain instances, electrical trees or water trees 200 may form in the dielectric insulating layer 106. Water trees 200 may generally be described as permanent structural damage to the dielectric insulating layer 106, unsurprisingly filled with water, which can cause significant reduction in the breakdown strength of the affected power cable 100. Water tree growth, or "treeing," generally progresses radially through the dielectric insulating layer 106, substantially parallel to the same direction as the local electric field. Thus, as shown in FIG. 2, water trees 200 may originate in the dielectric insulating layer 106 at a position substantially adjacent to the inner semiconductive shield 104, and progress radially through the dielectric insulating layer 106 toward the outer semiconductive shield 108.

After sufficient growth, such water trees 200 may lead to conductive arcing and damage to the power cable 100. Even juvenile water trees 200, however, may cause variations in the velocity and/or attenuation of signals transmitted along the central conductor 102. As discussed in detail below, these effects may be utilized to assess the severity of water trees 200 in energized power cables 100 and facilitate condition-based replacement of a damaged cable 100.

Referring now to FIGS. 3A-3C, in certain embodiments, a coupling device 300 may be embodied as a plug for coupling to a live underground power cable 100. In one embodiment, the coupling device 300 may include a housing 302 molded of an insulating material and formed to include an attachment portion 304 and an exposed portion 306. The attachment portion 304 may be sized to be matingly received by a test point (not shown) communicating with a live underground power cable 100. In certain embodiments, as discussed in more detail with reference to FIG. 6 below, the test point may be integrated with or otherwise associated with an electrical connector (not shown) attached to the power cable 100.

The exposed portion 306 may be formed to include a hole 308 to facilitate removing or otherwise manipulating the housing 302 with respect to the test point. Specifically, the hole 308 may be adapted to receive a "hot stick" or other tool known to those in the art for safely manipulating the housing 302. Of course, one skilled in the art will recognize that the size and shape of the exposed portion 306 may vary, and is not limited to configurations including a hole 308.

The housing 302 may contain various internal components to provide testing functionality for assessing insulation deterioration in a live underground power cable 100. For example, the housing 302 may include an electrode 316 to connect via a test point capacitor or other device to a center conductor 102 of a live underground power cable 100. In some embodiments, coupling circuitry 314 may be embedded within the housing 302 and coupled to the electrode 316. As discussed in more detail below, the coupling circuitry 314 may couple a test signal to the center conductor 102 to test an energized power cable 100. The coupling circuitry 314 may also detect the test signal after it has been propagated along the center conductor 102, and may transmit the detected test signal to an external analysis device (not shown) for analysis.

The housing 302 may further include a power source, such as a battery, to power any or all of the internal components. In one embodiment, the power source may be energy scavenged from the live underground power cable 100. For example, magnetic fields emitted by the power cable 100 may be converted to electrical energy with a transformer, such as one or more conductive loops, or the like.

In some embodiments, the housing 302 may include a transformer, such as a magnetically-conductive ring 310 and a coupling (secondary) coil 312, to magnetically couple the coupling circuitry 314 to an external device. The coupling coil 312 may be wound around the magnetically-conductive ring 310 within the housing 302. The magnetically-conductive ring 310 may comprise ferrite, for example, or another suitable magnetically-conductive material known to those in the art. A magnetic field induced in the magnetically-conductive ring 310 will generate an electrical current in the coupling coil 312, which in turn may be transmitted to the coupling circuitry 314. In this way, a test or other signal may be magnetically coupled to the coupling circuitry 314.

In certain embodiments, a primary coil (not shown) may be wound around the outside of the exposed insulating portion 306 of the housing 302 to induce a magnetic field in the magnetically-conductive ring 310. In other embodiments, the primary coil may be carried on a hot stick or other tool known to those in the art. The primary coil may be wirelessly or directly connected to a test signal generator or other device. This magnetic coupling may effectively couple high-frequency RF pulses onto a live underground power cable 100.

In a reverse scenario, the coupling circuitry 314 may detect received test signals, and may transmit such detected test signals to an external analysis device for analysis. For example, the coupling circuitry 314 may detect an electrical test signal received on the live underground power cable 100. This test signal may be electrically transmitted to the coupling coil 312, which will induce a magnetic field in the magnetically-conductive ring 310. This magnetic field may be detected by external circuitry, such as a primary electrical coil, to convert the magnetic field to an electrical signal. The resulting electrical signal may then be transmitted over a wire or wirelessly to an external analysis device for analysis.

As discussed in detail below, the external analysis device may analyze the detected test signal relative to a normal AC power signal traveling on the center conductor 102 of the power cable 100. Specifically, the velocity and/or attenuation of the detected test signal may be analyzed as a function of a normal AC power signal traveling on the same line 102 to infer the severity of electrical trees or water trees in the dielectric insulating layer 106 of the live underground power cable 100.

Figure 4:
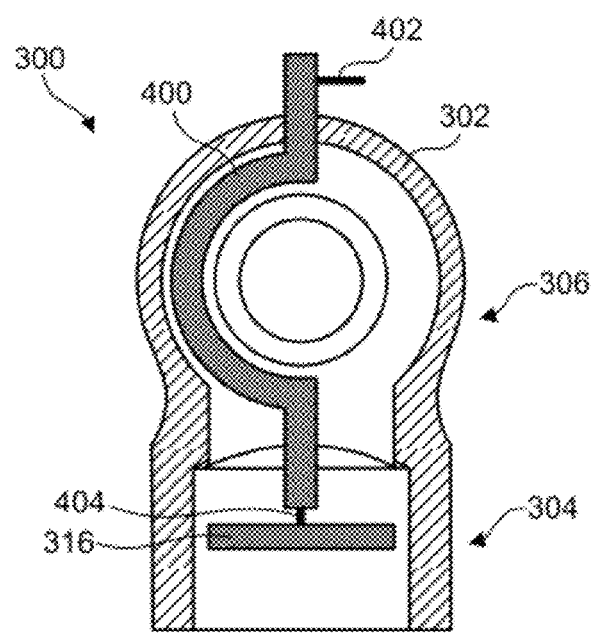
FIG. 4 is a front cross-sectional view of an alternative embodiment of a coupling device in accordance with the invention.

An alternative embodiment of a coupling device 300 in accordance with the invention is illustrated in FIG. 4. Like the embodiment of FIGS. 3A-3C, the coupling device 300 of FIG. 4 may include a housing 302 embodied as a plug to couple to a live underground power cable 100. The housing 302 may include an attachment portion 304 formed to fit into or over a power cable test point (not shown) having a complementary size and shape. An exposed portion 306 of the housing 302 may be formed to facilitate attachment and removal of the coupling device 300 relative to the test point. For example, in certain embodiments, the exposed portion 306 may include a hole 308 or ring-like portion to receive a "hot stick" or other tool for manipulating an energized power cable 100.

An electrical cable 400 may be integrated into the housing 302 to electrically couple the coupling device 300 to the live underground power cable 100. In one embodiment, a center conductor 404 of the electrical cable 400 may attach to an electrode 316 embedded within the housing 302. The electrode 316 may contact a capacitor or other device that connects to a center conductor 102 of the live underground power cable 100. A ground lead 402 may be used to connect a ground wire, such as a ground shield in the electrical cable 400, to ground.

The electrical cable 400 may be utilized to couple radio frequency ("RF") or other test signals onto the live underground power cable 100. Advantageously, this embodiment may be implemented on a substantially permanent or long-term basis to effectively monitor the integrity of a live power cable 100 on a periodic, intermittent, or substantially continuous basis over time.

Figure 5:
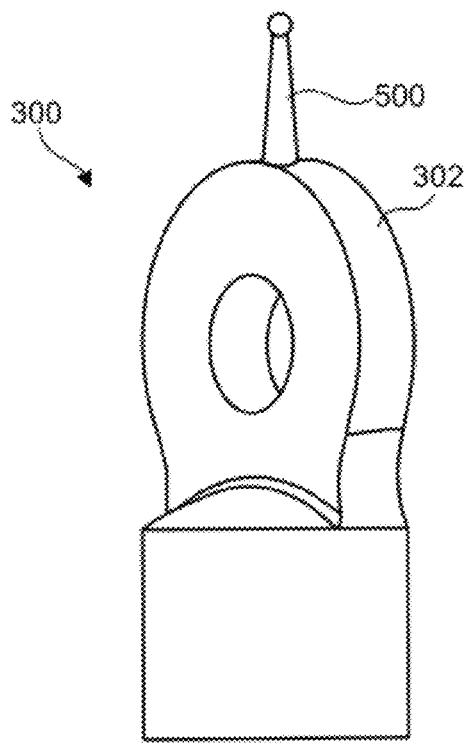
FIG. 5 is a perspective view of a third embodiment of a coupling device in accordance with the invention.

Referring now to FIG. 5, some embodiments of a coupling device 300 in accordance with the present invention may include a wireless device 500 attached to or integrated with the housing 302 to facilitate wireless communication of test signals between the coupling device 300 and an external device.

In one embodiment, RF test signals may be generated by an RF source such as an RF oscillator, a network analyzer, an RF amplifier fed by a tunable RF source, or the like, and wirelessly transmitted to the coupling device 300. A receiving antenna and associated wireless communication circuitry may be attached to the housing 302 or otherwise associated with the coupling device 300 to receive the RF test signals. As discussed in detail above, the receiving antenna may cooperate with components embedded within the housing 302 to electrically or inductively couple the received test signals onto the live underground power cable 100.

In another embodiment, an antenna and associated wireless communication circuitry may be coupled to the coupling device 300 to transmit detected test signals from the coupling device 300 to an external analysis device, such as a spectrum analyzer, computer, or other suitable device known to those in the art. Particularly, as described above with reference to FIGS. 3A-3C, internal components of the coupling device 300 may convert detected test signals to RF signals. Such RF signals may then be transmitted to an external analysis device by way of the antenna.

Figure 6:
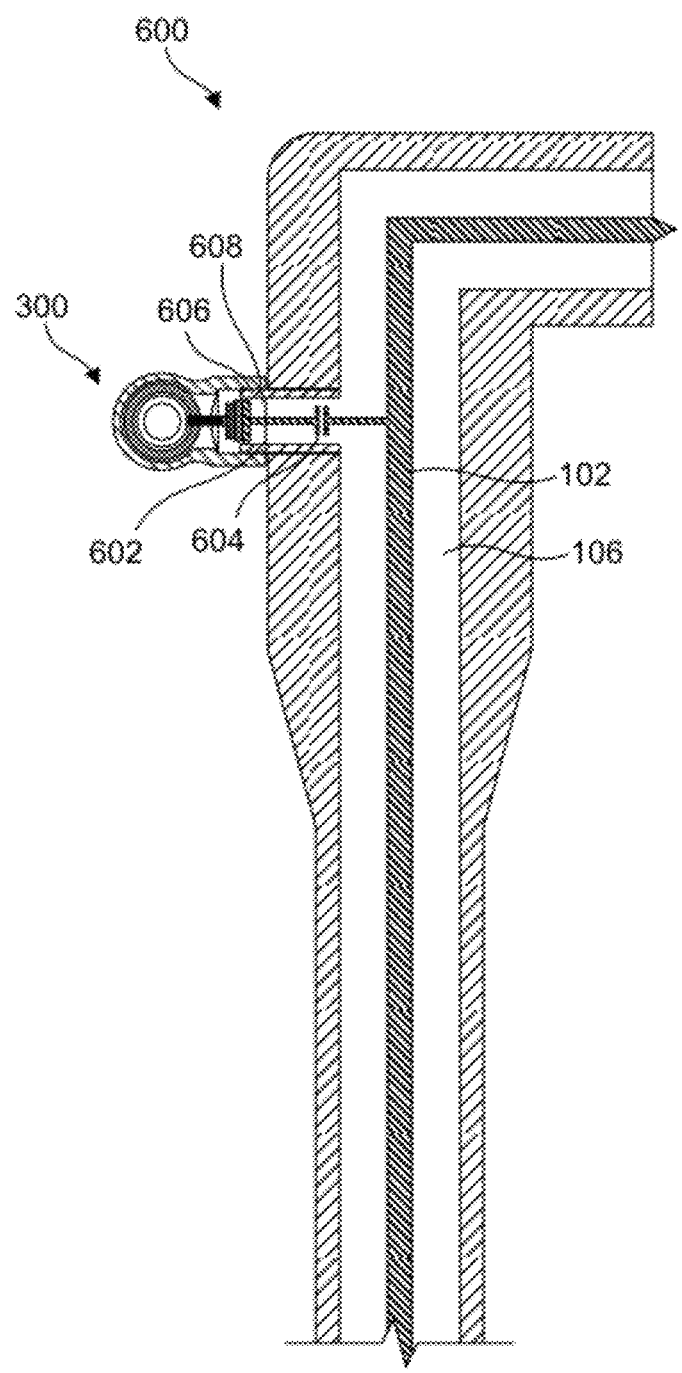
FIG. 6 is a cross-sectional view of a connector having a coupling device attached to a test point thereof in accordance with embodiments of the present invention.

Referring now to FIG. 6, one embodiment of a coupling device 300 in accordance with the present invention may be embodied as a plug to fit into or over a corresponding access cavity or test point 602 of an electrical power cable connector 600. Such a connector 600 may include, for example, a load-break elbow, deadbreak connector, tee connector, or the like. The connector 600 may interconnect sources of energy, such as transformers and circuit breakers, to distribution systems via a high voltage power cable 100. The connector 600 may also enable a utility worker to safely disconnect a power cable 100 from a transformer, switch box, or the like.

FIG. 6 shows a very high-level schematic of an elbow connector 600 for connecting a power cable 100 to a transformer, switch box, or the like. As shown, the elbow connector 600 includes a test point 602 providing access to the interior of the electrical connector 600 and, specifically, to the center conductor 102 of the power cable 100. In some embodiments, the test point 602 may include a capacitor 604 to contact an electrode 316 of a coupling device 300.

In operation, the attachment portion 304 of a coupling device 300 may matingly correspond to the test point 602. For example, in some embodiments, the test point 602 may include a projection 606 corresponding to an opening 608 in the attachment portion 304 of the coupling device 300, thereby enabling a press-fit between the two. In other embodiments, the attachment portion 304 may be inserted or threaded into an access cavity embodying the test point 602. Of course, one skilled in the art will recognize that the coupling device 300 may be attached to the test point 602 by any means known to those in the art, and that the attachment means presented herein are provided by way of example and not limitation. In any case, the electrode 316 of the coupling device 300 may directly or indirectly contact the center conductor 102 of the connector 600 when the coupling device 300 and test point 602 are matingly connected.

Figure 7A:
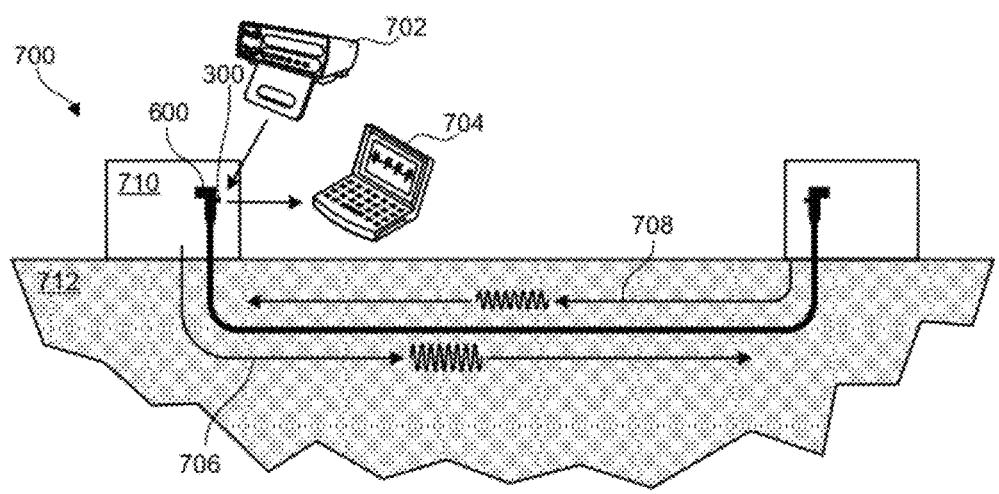
FIG. 7A is a schematic diagram of one embodiment of a system for assessing insulation deterioration in accordance with the present invention, where an input test signal is reflected back for analysis.
Figure 7B:
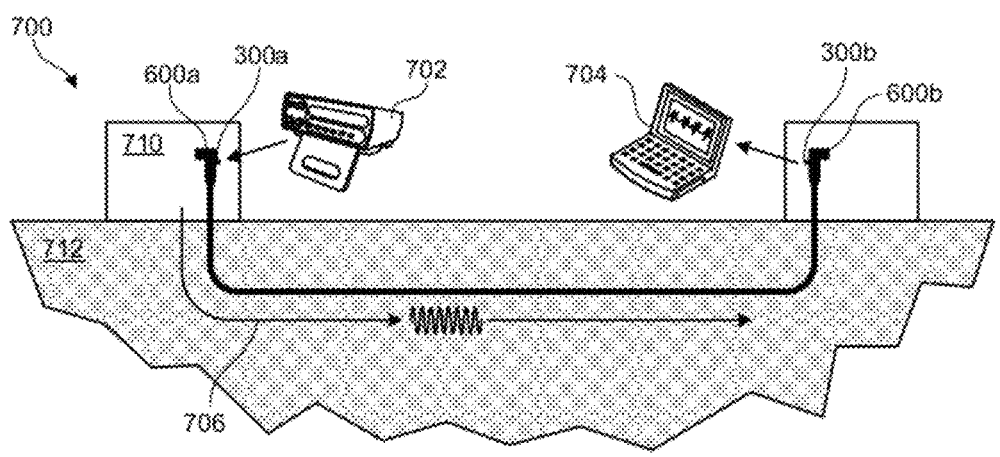
FIG. 7B is a schematic diagram of an alternative embodiment of a system in accordance with the invention, where an input test signal is extracted at a remote test point for analysis.

Referring now to FIGS. 7A and 7B, a system 700 for assessing insulation deterioration in a live underground power cable 100 may include a coupling device 300 attached to a test point 602 on a connector 600. The connector 600 may be attached to a transformer, switch box, or other termination point 710 to interconnect with an underground power distribution system. Specifically, the connector 600 may enable power, communication, and other signals to travel along the center conductor 102 of a power cable 100 buried underground 712.

In operation, a test signal generator 702 may generate a test signal having a frequency different from the normal AC power frequency carried by the power cable 100. The test signal generator 702 may communicate with the coupling device 300 to couple the test signal onto the power cable 100. In some embodiments, as shown in FIG. 7A, the test signal may be propagated along the cable 100 in a first direction 706, and then reflected back to the coupling device 300 in a second direction 708. This reflection may be caused by impedance mismatches or other imperfections in the center conductor 102. The reflected test signal may be extracted from the coupling device 300 and transmitted to an external analysis device 704 for analysis. Advantageously, this embodiment of a system for assessing insulation deterioration in a live underground power cable 100 may require access to only one point 602 or end of a length of cable 100.

In other embodiments, as shown in FIG. 7B, a test signal may be generated by the test signal generator 702 and communicated to a first coupling device 300a attached to a first connector 600a. The test signal may be propagated along the center conductor 102 in a single direction 706 from the first coupling device 300a to a second coupling device 300b. The second coupling device 300b may be attached to a remote test point 602, where such test point 602 is integrated into a second connector 600b attached to the power cable 100 at a remote location. The test signal may then be extracted from the second coupling device 300b and transmitted to an external analysis device 704 for analysis.

In some embodiments, existing communication infrastructure may be used for transmitting the detected test signal to the external analysis device 704. Such existing infrastructure may include, for example, common cellular systems, proprietary communication systems used by power utility companies, such as Supervisory Control and Data Acquisition systems ("SCADA"), powerline carrier systems, and SmartMeter™ communication systems. Further, in some embodiments, the external analysis device 704 may store multiple detected test signal results to facilitate interpretation of test results over time.

In addition, in some embodiments, one or more coupling devices 300a, 300b may be used to couple timing, communication, or other signals to the power cable 100 under test. For example, a pair of timing signals may be used to support a determination of velocity of propagation within the power cable 100. A first timing signal may be an electrical signal introduced onto the cable 100 at a first coupling device 300a and received by a second coupling device 300b. This first timing signal may be carried on the central conductor 102 or on the concentric neutral wires 110 of the power cable 100.

The second timing signal may be an optical signal, wireless radio signal, or other such signal known to those in the art capable of freely propagating outside the power cable 100. The second timing signal may be transmitted from one coupling device 300a to the other 300b. The first and second timing signals may then be measured and compared to identify changes in the velocity of propagation within the cable 100. Such a comparison may support an inference of water trees along the length of cable 100 under test. In other embodiments, time domain reflectometry ("TDR") or other such methods known to those in the art may be used to measure velocity of propagation characteristics of the cable 100.

Similarly, various methods may be used to measure attenuation of the test signal along the length of cable 100 under test. For example, an alternative method for measuring the change of permittivity resulting from the applied power-frequency voltage utilizes the reflections of the test signals from the discontinuities at each end of the cable section under test. At selected phases of the applied power-frequency voltage, one can vary the frequency of the applied test signal while observing the input impedance of the cable section. From the test signal frequencies at which the cable becomes resonant, one can calculate the test signal phase velocity. If this phase velocity changes as the applied power-frequency voltage is changed, the permittivity of the insulation is voltage dependant and the cable is thus a candidate for replacement.

Figure 8:
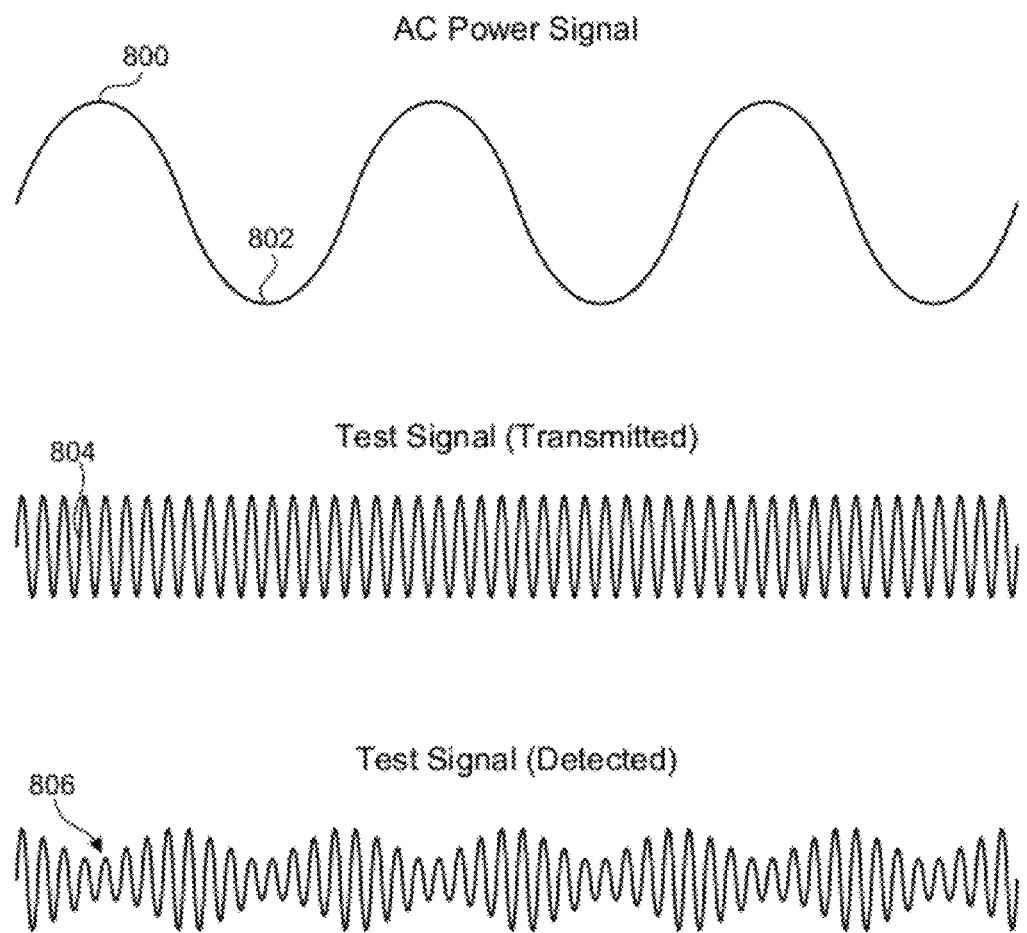
FIG. 8 is an exemplary illustration of an AC power signal relative to an input test signal and a detected test signal in accordance with embodiments of the invention.

Referring now to FIG. 8, the electrical conductivity and/or permittivity of the dielectric insulating layer 106 of a power cable 100 may depend on the electric field existing within the cable 100. Accordingly, the characteristics of a test signal generated and coupled onto a live underground power cable 100 in accordance with embodiments of the present invention may be analyzed with reference to the normal AC power signal simultaneously carried on the same cable 100. This direct comparison may indicate changes in the velocity and/or attenuation of the test signal that may be attributed to water trees in the dielectric insulating layer 106 of the cable 100 under test.

A normal AC power signal carried on a power cable 100 may be characterized by a frequency of 50 Hz or 60 Hz, with the alternating voltage represented as alternating peaks 800 and valleys 802 on a sine wave graph. Embodiments of the present invention may couple a high-frequency test signal onto the power cable 100, such that each peak 800 and valley 802 of the normal AC power signal corresponds to multiple cycles of the transmitted test signal.

Absent any structural defects in the dielectric insulating layer 106 of the power cable 100, the peak-to-peak amplitude 804 of the test signal may be expected to stay substantially constant. Where electrical trees or water trees have formed in the dielectric insulating layer 106, however, the test signal may demonstrate periodic changes of attenuation corresponding to the peaks 800 and valleys 802 of the AC power signal.

Indeed, the peaks 800 and valleys 802 of the AC power signal correspond to the times when the potential difference between the center conductor 102 and the outer semiconductive shield 108 is greatest, that is when the electric field is greatest between the center conductor 102 and the outer semiconductive shield 108. If any water trees are present in the dielectric insulating layer 106, it is at these times that they may cause changes of the permittivity and/or connectivity of the insulation and corresponding changes in the velocity of propagation or the attenuation of the test signal in the power cable 100.

As shown in FIG. 8, for example, attenuation in the test signal corresponds to the peaks 800 and valleys 802 of the AC power signal, indicating the presence of water trees in the cable 100 under test. Where water trees in the dielectric insulating layer 106 are severe, attenuation in the test signal may be more pronounced. Likewise, where water trees in the dielectric insulating layer 106 are just starting to develop, attenuation in the test signal may be less obvious. As discussed above with reference to FIGS. 7A and 7B, the velocity of propagation of the signal may also be expected to vary in accordance with the severity of water trees in the dielectric insulating layer 106 of the cable 100.

The invention may be embodied in other specific forms without departing from its spirit or essential characteristics. The described examples are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A system for assessing insulation deterioration in a live underground power cable, the system comprising:
   a test signal generation device to generate a test signal;
   a coupling device to couple the test signal onto a live underground power cable carrying a normal AC power signal, the test signal having a frequency different from a frequency of the normal AC power signal;
   a detection device to detect the test signal after it as traveled a distance along the live underground power cable; and
   an analysis device to analyze the detected test signal to determine a change in at least one of velocity and attenuation of the test signal as a function of the normal AC power signal.

2. The system of claim 1, wherein the detection device is the coupling device.

3. The system of claim 1, wherein the coupling device is embodied as a plug for attachment to a test point of a connector, wherein the connector is attached to the live underground power cable.

4. The system of claim 1, wherein the analysis device comprises a time domain reflectometer to perform cable phase velocity measurements.

5. The system of claim 1, wherein the coupling device is one of magnetically and electrically coupled to the analysis device.

6. A method for assessing insulation deterioration in a live underground power cable, the method comprising:
   attaching a coupling device to a live underground power cable, the live underground power cable carrying a normal AC power signal at a first frequency;
   coupling a test signal onto the live underground power cable by way of the coupling device, the test signal having a second frequency different from the first frequency;
   detecting the test signal on the live underground power cable after it has traveled a distance along the live underground power cable;
   analyzing the detected test signal to determine a change in at least one of velocity and attenuation of the test signal as a function of the normal AC power signal; and
   inferring the severity of water trees in the live underground power cable based on the magnitude of the change.

7. The method of claim 6, wherein the coupling device is embodied as a plug configured for insertion into a test point of a connector, wherein the connector is attached to the live underground power cable.

8. The method of claim 6, wherein the test signal is reflected along the live underground power cable at a point remote from the coupling device.

9. The method of claim 8, wherein detecting the test signal comprises extracting the test signal from the coupling device after test signal has been reflected.

10. The method of claim 6, wherein detecting the test signal comprises extracting the test signal from a second coupling device coupled to the live underground power cable.

11. The method of claim 6, wherein coupling the test signal onto the live underground power cable comprises wirelessly transmitting the test signal to the coupling device.

12. The method of claim 6, further comprising propagating a timing signal outside of the live underground power cable.

13. The method of claim 12, wherein the timing signal comprises one of a radio signal and an optical signal.

14. The method of claim 6, further comprising transmitting the detected test signal to an analysis device for analysis.

15. The method of claim 14, wherein transmitting the detected test signal to the analysis device comprises wirelessly transmitting the detected test signal to the analysis device.

16. The method of claim 6, wherein the coupling device is one of magnetically coupled and electrically coupled to the analysis device.

\* \* \* \* \*